US010784384B2

(12) United States Patent
Seki

(10) Patent No.: US 10,784,384 B2
(45) Date of Patent: Sep. 22, 2020

(54) SOLAR CELL MODULE

(71) Applicant: PANASONIC INTELLECTUAL PROPERTY MANAGEMENT CO., LTD., Osaka (JP)

(72) Inventor: Yuta Seki, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 16/363,855

(22) Filed: Mar. 25, 2019

(65) Prior Publication Data
US 2019/0221687 A1 Jul. 18, 2019

Related U.S. Application Data

(63) Continuation of application No. PCT/JP2017/031873, filed on Sep. 5, 2017.

(30) Foreign Application Priority Data

Sep. 26, 2016 (JP) ................. 2016-187544

(51) Int. Cl.
H01L 31/0224 (2006.01)
H01L 31/048 (2014.01)
H01L 31/05 (2014.01)
H01L 31/042 (2014.01)

(52) U.S. Cl.
CPC ........... H01L 31/022433 (2013.01); H01L 31/022425 (2013.01); H01L 31/042 (2013.01); H01L 31/048 (2013.01); H01L 31/0512 (2013.01)

(58) Field of Classification Search
None
See application file for complete search history.

(56) References Cited

U.S. PATENT DOCUMENTS

2016/0284893 A1* 9/2016 Teramura .......... H01L 31/02243

FOREIGN PATENT DOCUMENTS

JP 2008-235354 A 10/2008

OTHER PUBLICATIONS

International Search Report and Written Opinion dated Oct. 31, 2017 in International Application No. PCT/JP2017/031873; with partial English translation.

* cited by examiner

Primary Examiner — Magali P Slawski
(74) Attorney, Agent, or Firm — McDermott Will and Emery LLP

(57) ABSTRACT

A solar cell module includes: two solar cells adjacent to each other, the two solar cells each having a first main surface and a second main surface. At least one solar cell of the two solar cells includes: a plurality of first finger electrodes disposed on the first main surface; a plurality of second finger electrodes disposed on the second main surface; and a plurality of reinforcement lines disposed on the second main surface. The plurality of reinforcement lines are disposed at positions where the plurality of reinforcement lines at least partially overlap the plurality of first finger electrodes, respectively, in a front view of the at least one solar cell, and a first pitch between the plurality of reinforcement lines is different from a second pitch between the plurality of second finger electrodes.

4 Claims, 3 Drawing Sheets

FIRST MAIN SURFACE (FRONT SURFACE)

SECOND MAIN SURFACE (BACK SURFACE)

SOLAR CELL MODULE

CROSS REFERENCE TO RELATED APPLICATIONS

This application is a U.S. continuation application of PCT International Patent Application Number PCT/JP2017/031873 filed on Sep. 5, 2017, claiming the benefit of priority of Japanese Patent Application Number 2016-187544 filed on Sep. 26, 2016, the entire contents of which are hereby incorporated by reference.

BACKGROUND

1. Technical Field

The present disclosure relates to a solar cell module.

2. Description of the Related Art

In recent years, solar cell modules have been progressively developed as photoelectric conversion devices that convert light energy into electrical energy. Solar cell modules can directly convert inexhaustible sunlight into electricity, which has less environmental impact than power generation using fossil fuels. Accordingly, such solar cell modules generate power cleanly, and thus are expected to provide new energy sources.

For example, a solar cell module has a structure in which solar cells are encapsulated by an encapsulant member between a front surface protection member and a back surface protection member, for example. In the solar cell module, the solar cells are disposed in a matrix. Two adjacent solar cells among solar cells linearly aligned in either the row direction or the column direction are connected by a tab line to form a string.

Japanese Unexamined Patent Application Publication No. 2008-235354 has proposed a solar cell module in which finger electrodes formed on the light-receiving surface (front surface) overlap finger electrodes formed on the back surface of the solar cell in a front view of the solar cell. This suppresses shearing stress that occurs in the solar cell when pressure is applied to the finger electrodes.

SUMMARY

However, in order to suppress the shearing stress, it is desirable that a solar cell has a configuration in which the positions of finger electrodes formed on the front surface correspond to the positions of finger electrodes formed on the back surface in the front view of the solar cell. The finger electrodes in the conventional solar cell module have had restrictions on their configurations. For example, when the number of the finger electrodes on one surface (for example, front surface) is set to x, to make the finger electrodes on the front surface respectively overlap the finger electrodes on the back surface in the front view, it is necessary to set the number of the finger electrodes on one surface (for example, back surface) to x+n(x−1) (n is an integer greater than or equal to 0), and set the pitch between the finger electrodes on the other surface to 1/(n+1) with respect to the pitch between the finger electrodes on one surface.

In view of this, the present disclosure has been conceived in order to solve the above problem, and an object of the present disclosure is to provide a solar cell module which can ease restrictions on the design of the finger electrodes and suppress shearing stress that occurs in the solar cells.

In order to solve the aforementioned problem, a solar cell module according to one aspect of the present disclosure includes: two solar cells adjacent to each other, the two solar cells each having a first main surface and a second main surface; and at least two tab lines that electrically connect the two solar cells. At least one solar cell of the two solar cells includes: at least two first bus bar electrodes disposed on the first main surface; a plurality of first finger electrodes disposed on the first main surface and extending in a direction intersecting the at least two first bus bar electrodes; at least two second bus bar electrodes disposed on the second main surface; a plurality of second finger electrodes disposed on the second main surface and extending in a direction intersecting the at least two second bus bar electrodes; and a plurality of reinforcement lines disposed on the second main surface and extending from the at least two second bus bar electrodes in the direction intersecting the at least two second bus bar electrodes. The plurality of reinforcement lines are disposed at positions where the plurality of reinforcement lines at least partially overlap the plurality of first finger electrodes, respectively, in a front view of the at least one solar cell. A first pitch between the plurality of reinforcement lines is different from a second pitch between the plurality of second finger electrodes, the first pitch being an interval between positions where the plurality of reinforcement lines intersect the at least two second bus bar electrodes, the second pitch being an interval at a midpoint between two adjacent tab lines among the at least two tab lines.

The solar cell module according to one aspect of the present disclosure makes it possible to ease the restrictions on the design of the finger electrodes and suppress shearing stress that occurs in the solar cells.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENT

In the following, a solar cell module according to an embodiment of the present disclosure is described in detail with reference to the drawings. The embodiment described below shows a preferred example of the present disclosure. Thus, the numerical values, shapes, materials, structural components, and the arrangement and connection of the structural components, for instance, presented in the following embodiment are mere examples, and thus are not intended to limit the present disclosure. Thus, among the structural components in the embodiment below, structural components not recited in any one of independent claims which indicate the broadest concepts of the present disclosure are described as optional structural components.

Each figure is a schematic diagram and is not necessarily illustrated precisely. In each figure, structural members that are essentially the same share like reference signs.

In the present specification, the term "approximately equal" is intended to mean not only exactly equal, but also what is recognized as substantially equal.

Embodiment

1. Basic Configuration of Solar Cell Module

An example of a basic configuration of solar cell module 1 according to the present embodiment is described with reference to FIG. 1.

Figure 1:
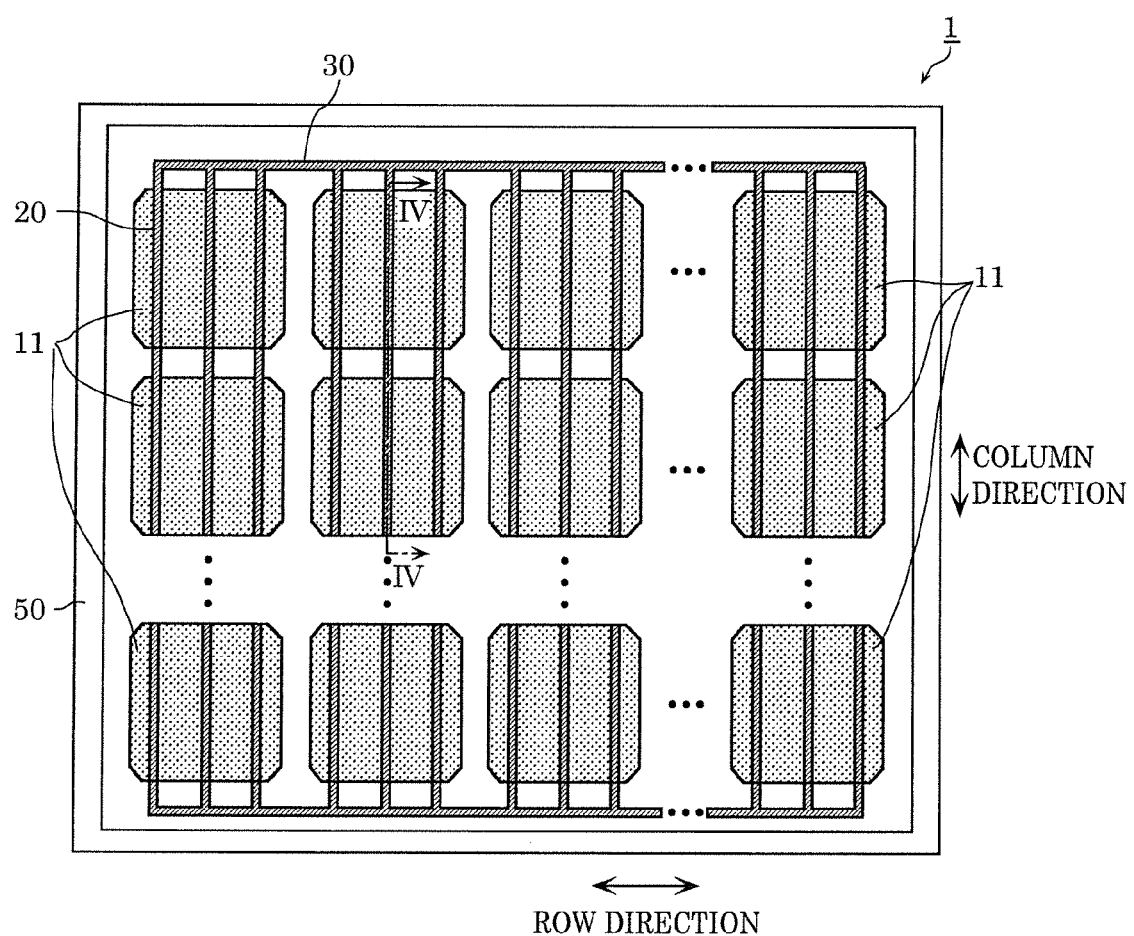
FIG. 1 is an external plan view of a solar cell module according to an embodiment.

FIG. 1 is an external plan view of solar cell module 1 according to the embodiment. Solar cell module 1 shown in the diagram includes a plurality of solar cells 11, tab lines 20, connecting lines 30, and frame 50.

Solar cells 11 are plate-like photovoltaic cells disposed in a two dimensional array, and generate electric power by being irradiated with the sunlight.

Tab lines 20 are wiring members. At least two tab lines 20 are disposed in parallel to each other on solar cells 11, and electrically connect two solar cells 11 adjacent to each other in a column direction. In the present embodiment, three tab lines 20 electrically connect two adjacent solar cells. Note that each tab line 20 may have a light-diffusing shape on a surface of a light entering side. The light-diffusing shape means a shape having a function of diffusing light. This light-diffusing shape diffuses the light which has fallen on the surface of tab line 20, and causes the diffused light to be redistributed to solar cell 11.

Connecting lines 30 are wiring members that connect solar cell strings. Note that a solar cell string is an aggregate of solar cells 11 disposed in the column direction and connected by tab lines 20. Note that each connecting line 30 may have the light-diffusing shape on a surface on the light entering side. This diffuses the light which has entered between solar cell 11 and frame 50 on the surface of connecting line 30, and causes the diffused light to be redistributed to solar cell 11.

Frame 50 is an outer frame member that covers a peripheral part of a panel on which solar cells 11 are disposed in the two dimensional array.

Although not illustrated, a light-diffusing member may be disposed between two adjacent solar cells 11. This causes the light which has entered a space between solar cells 11 to be redistributed to solar cells 11, and thus the efficiency of collecting light of solar cell 11 improves. Accordingly, the photoelectric conversion efficiency of the whole solar cell module 1 can be improved.

2. Structure of Solar Cell

The structure of each solar cell 11, which is a main structural component of solar cell module 1, is described.

Figure 2A:
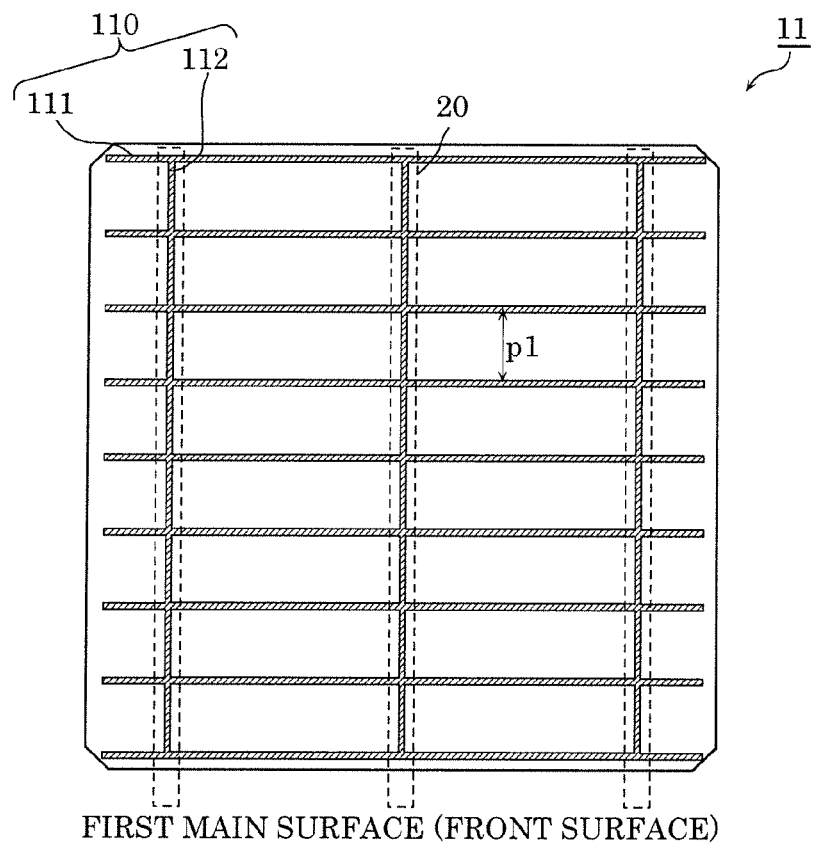
FIG. 2A is a plan view of a solar cell according to the embodiment, seen from a first main surface of the solar cell.

FIG. 2A is a plan view of solar cell 11 according to the embodiment, seen from a first main surface of solar cell 11. Here, the first main surface is the front surface. As illustrated in the figure, solar cell 11 is approximately square in the plan view. Solar cell 11 has a length of 125 mm, a width of 125 mm, a thickness of 200 µm, for example. On the front surface of solar cell 11, at least two bus bar electrodes 112 (first bus bar electrodes) are formed in parallel to each other. Each of the at least two bus bar electrodes 112 is joined to tab line 20 to overlap tab line 20. In FIG. 2A, tab lines 20 are indicated with dashed lines and tab lines 20 are joined to bus bar electrodes 112 to overlap bus bar electrodes 112. In the present embodiment, three bus bar electrodes 112 are respectively formed under three tab lines 20. Furthermore, on the front surface, a plurality of stripe finger electrodes 111 (first finger electrodes) are disposed and extend in parallel to one another in a direction intersecting (for example, orthogonal to) the at least two bus bar electrodes 112. In the present embodiment, nine finger electrodes 111 are disposed at the same pitch p1, which is a first pitch. Bus bar electrodes 112 and finger electrodes 111 constitute collector electrode 110 on the front surface.

Figure 2B:
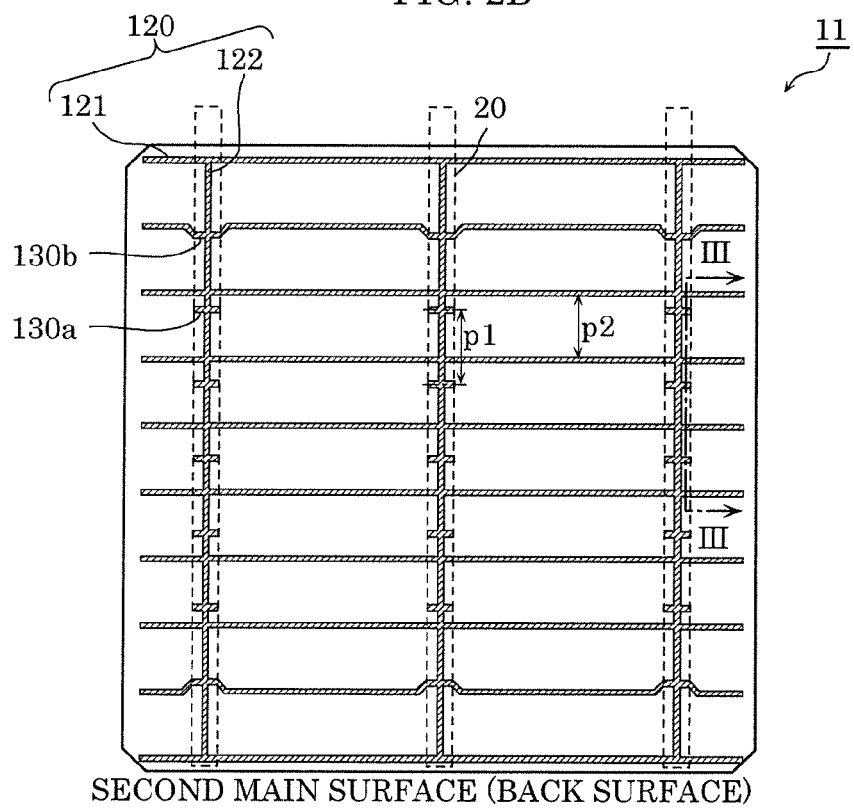
FIG. 2B is a plan view of the solar cell according to the embodiment, seen from a second main surface of the solar cell.

FIG. 2B is a plan view of solar cell 11 according to the embodiment, seen from a second main surface of solar cell 11. Here, the second main surface is the back surface. On the back surface of solar cell 11, at least two bus bar electrodes 122 (second bus bar electrodes) are disposed in parallel to each other. Each of the at least two bus bar electrodes 122 are joined to tab line 20 to overlap tab line 20. In the present embodiment, three bus bar electrodes 122 are respectively formed under three tab lines 20. Furthermore, on the back surface, a plurality of stripe finger electrodes 121 (second finger electrodes) are disposed and extend in parallel to one another in the direction intersecting (for example, orthogonal to) the at least two bus bar electrodes 122. In the present embodiment, ten finger electrodes 121 are disposed at the same pitch p2, which is a second pitch. Note that pitch p2 is an interval between finger electrodes 121 at a midpoint between two adjacent tab lines 20 among tab lines 20. As illustrated in FIG. 2B, since finger electrodes 121 are bent in the vicinity of bus bar electrodes 122, the pitch between finger electrodes 121 in the vicinity of bus bar electrode 122 is not the same. Thus, the pitch between finger electrodes 121 is set to pitch p2 at a midpoint between two adjacent tab lines 20, where the pitch is the same. Pitch p2 is an interval different from pitch p1 illustrated in FIG. 2A. Bus bar electrodes 122 and finger electrode 121 constitute collector electrode 120 on the back surface.

Furthermore, on the back surface, a plurality of reinforcement lines 130 are disposed and extend from at least at least two bus bar electrodes 122 in parallel to one another in a direction intersecting (for example, orthogonal to) the at least two bus bar electrodes 122. Note that the term "reinforcement lines 130" includes reinforcement line 130a that is not included in part of finger electrode 121 as well as reinforcement line 130b that is included in part of finger electrode 121. Reinforcement lines 130a and 130b may be generically referred to as reinforcement lines 130, and reinforcement line 130a or 130b may be generically referred to as reinforcement line 130.

Reinforcement lines 130 are joined to tab lines 20 to overlap tab lines 20 along the width direction of tab lines 20. As illustrated in FIG. 2B, the length of each of reinforcement lines 130 may be approximately equal to the width of each of the at least two tab lines 20. Note that the meaning of the term "approximately equal" includes that the length of reinforcement line 130 being longer than the width of tab line 20. More specifically, the expression "the length of reinforcement line 130 being longer than the width of tab line 20" here means that the length of reinforcement line 130 is long enough so that tab line 20 does not protrude from reinforcement line 130 when the position of tab line 20 slightly deviates from the position of reinforcement line 130 at the time of joining tab line 20 and reinforcement line 130 together.

Reinforcement lines 130 are disposed at positions on the back surface where reinforcement lines 130 partially overlap finger electrodes 111 disposed on the front surface, respectively, in the front view of solar cell 11. Although "reinforcement lines 130 at least partially overlap finger electrodes 11, respectively" here means that, for example, each of reinforcement lines 130 at least partially overlaps a corresponding one of finger electrodes 111 in the front view of solar cell 11, a center line in the width direction of each reinforcement line 130 may overlap a center line in the width direction of a corresponding finger electrode 111. This makes the pitch between reinforcement lines 130 approximately equal to the pitch between finger electrodes 111, which is pitch p1, as illustrated in FIG. 2B. In other words, pitch p1 between reinforcement lines 130 is different from pitch p2 between finger electrodes 121. Note that when finger electrode 121 is formed at a position on the back surface that overlaps the position where finger electrode 111 is formed, reinforcement line 130 will not be formed at the position where finger electrode 121 is formed. For example, among finger electrodes 121 illustrated in FIG. 2B, the uppermost and lowermost positions where finger electrodes 121 are disposed in FIG. 2B are the positions where finger electrodes 121 overlap finger electrodes 111 in the front view of solar cell 11, and thus reinforcement lines 130 are not formed at such positions.

The width of each of reinforcement lines 130 may be approximately equal to the width of each of finger electrodes 111. Note that the meaning of the term "approximately equal" includes that the width of reinforcement line 130 being longer than the width of finger electrode 111. More specifically, the expression "the width of reinforcement line 130 being longer than the width of finger electrode 111" here means that the width of reinforcement line 130 is long enough to overlap finger electrode 111 in the front view of solar cell 11 when reinforcement line 130 slightly deviates from finger electrode 111 at the time of forming reinforcement line 130.

Collector electrodes 110 and 120 may be formed by a printing method, such as screen printing, using a thermosetting resin conductive paste including a resin material as a binder and conductive particles such as silver particles as a filler, for example. Reinforcement lines 130 are made of the same materials as the materials of collector electrode 120. Reinforcement lines 130 and collector electrode 120 are formed at the same time when collector electrode 120 is formed by a printing method, such as screen printing, for example. In other words, reinforcement lines 130 constitute collector electrode 120 together with bus bar electrodes 122 and finger electrodes 121.

The width of bus bar electrodes 112 and 122 is from 50 μm to 200 μm, for example, and the width of finger electrodes 111 and 121 is from 40 μm to 100 μm, for example. The width of tab line 20 is about 1 mm, for example. As described above, since the length of reinforcement line 130 is approximately equal to the width of tab line 20, the length of reinforcement line 130 is about 1 mm, for example. As described above, since the width of reinforcement line 130 is approximately equal to the width of finger electrode 111, the width of reinforcement line 130 is from 40 μm to 100 μm, for example. In FIGS. 2A and 2B, although nine finger electrodes 111 and ten finger electrodes 121 are shown for the purpose of illustration, the numbers of finger electrodes 111 and 121 may be increased to improve efficiency of collecting charges generated from the received light.

As illustrated in FIGS. 2A and 2B, pitch p2 between finger electrodes 121 on the back surface is smaller than pitch p1 between finger electrodes 111 on the front surface. In other words, the number of finger electrodes 121 on the back surface is greater than the number of finger electrodes 111 on the front surface. Specifically, the surface area occupancy of collector electrode 120 formed on the back surface may be greater than the surface area occupancy of collector electrode 110 formed on the front surface. Here, the surface area occupancy of the collector electrode is a proportion of a total area occupied by the bus bar electrodes and the finger electrodes with respect to the area of solar cell 11 in the plan view.

When the electrodes are arranged on the back surface as described above, the efficiency of collecting charges on the back surface increases, but more light is prevented from entering through the back surface compared with light prevented from entering through the front surface. However, since solar cell 11 according to the present embodiment is a monofacial solar cell whose light-receiving surface is a front surface, for example, an increase in the efficiency of collecting charges on the back surface has greater influence on solar cell 11 than an increase in the amount of light prevented from entering through the back surface. This achieves improvement in the efficiency of collecting charges of solar cell 11.

Figure 3:
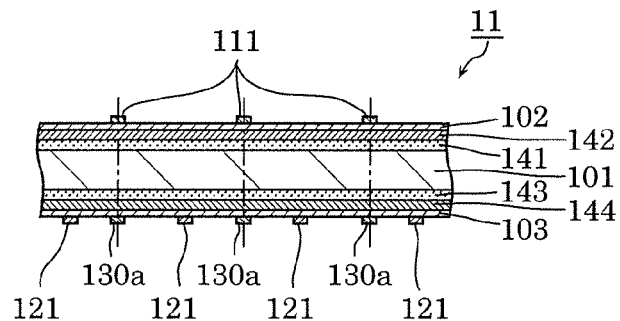
FIG. 3 is a cross-sectional view illustrating a layered structure of the solar cell according to the embodiment.

FIG. 3 is a cross-sectional view illustrating a layered structure of solar cell 11 according to the embodiment. Note that FIG. 3 is a cross-sectional view of solar cell 11 taken along line III-III in FIG. 2B. As illustrated in FIG. 3, i-type amorphous silicon film 141 and p-type amorphous silicon film 142 are formed in stated order on the main surface of n-type monocrystalline silicon wafer 101. N-type monocrystalline silicon wafer 101, i-type amorphous silicon film 141, and p-type amorphous silicon film 142 form a photoelectric conversion layer, and n-type monocrystalline silicon wafer 101 serves as a main power generation layer. Furthermore, light-receiving surface electrode 102 is formed on p-type amorphous silicon film 142. As illustrated in FIG. 2A, collector electrode 110 including bus bar electrodes 112 and finger electrodes 111 is formed on light-receiving surface electrode 102.

On the back surface of n-type monocrystalline silicon wafer 101, i-type amorphous silicon film 143 and n-type amorphous silicon film 144 are formed in stated order. Furthermore, light-receiving surface electrode 103 is formed on n-type amorphous silicon film 144. As illustrated in FIG. 2B, collector electrode 120 including bus bar electrodes 122 and finger electrodes 121 are formed on light-receiving surface electrode 103. Reinforcement lines 130 (130a) are formed on light-receiving surface electrode 103. Note that FIG. 3 shows finger electrodes 111 included in collector electrode 110, finger electrodes 121 included in collector electrode 120, and reinforcement lines 130. As described above, reinforcement lines 130 are formed at positions on the back surface where reinforcement lines 130 at least partially overlap finger electrodes 111, respectively, in the front view of solar cell 11. In FIG. 3, the alternate long and short dash lines show that reinforcement lines 130 are formed at positions where reinforcement lines 130 overlap finger electrodes 111, respectively, in the front view of solar cell 11. Although FIG. 3 shows that reinforcement lines 130a are formed at positions where reinforcement lines 130a overlap finger electrodes 111 in the front view of solar cell 11, reinforcement lines 130b included in part of finger electrodes 121 which are not illustrated in FIG. 3 are also formed at positions where reinforcement lines 130b overlap finger electrodes 111, respectively, in the front view of solar cell 11.

As described above, pitch p1 between finger electrodes 111 is different from pitch p2 between finger electrodes 121. Thus, although it depends on the numbers of finger electrodes 111 and finger electrodes 121, as shown in FIG. 3, finger electrodes 121 are likely to be formed at positions where finger electrodes 121 do not overlap finger electrodes 111 in the front view of solar cell 11.

Note that, p-type amorphous silicon film 142 may be formed on the back surface of n-type monocrystalline silicon wafer 101, and n-type amorphous silicon film 144 may be formed on the light-receiving surface side of n-type monocrystalline silicon wafer 101.

Solar cell 11 according to the present embodiment has a structure in which i-type amorphous silicon film 141 is disposed between n-type monocrystalline silicon wafer 101 and p-type amorphous silicon film 142, and i-type amorphous silicon film 143 is disposed between n-type monocrystalline silicon wafer 101 and n-type amorphous silicon film 144 to improve p-n junction properties.

Solar cell 11 according to the present embodiment is a monofacial solar cell as described above, and light-receiving surface electrode 102 on the front surface side of n-type monocrystalline silicon wafer 101 serves as a light-receiving surface. Charge carriers generated in n-type monocrystalline silicon wafer 101 are diffused as photocurrent to light-receiving surface electrodes 102 and 103 on the front surface side and the back surface side, and collected by bus bar electrodes 112 and 122, and finger electrodes 111 and 121.

Light-receiving surface electrodes 102 and 103 are transparent electrodes made of indium tin oxide (ITO), tin oxide ($SnO_2$), zinc oxide (ZnO), etc., for example. Note that light-receiving surface electrode 103 on the back surface side may be a metal electrode, which is not transparent.

Note that solar cell 11 according to the present embodiment may be a bifacial solar cell. In this case, light-receiving surface electrode 102 on the front surface side of n-type monocrystalline silicon wafer 101 and light-receiving surface electrode 103 on the back surface side of n-type monocrystalline silicon wafer 101 serve as light-receiving surfaces. Charge carriers generated in n-type monocrystalline silicon wafer 101 are diffused as photoelectric current to light-receiving surface electrodes 102 and 103 on the front surface side and the back surface side, and collected by bus bar electrodes 112 and 122, and finger electrodes 111 and 121. In this case, light-receiving surface electrodes 102 and 103 are transparent electrodes.

3. Structure of Solar Cell Module

Next, a specific structure of solar cell module 1 according to the present embodiment is described.

Figure 4:
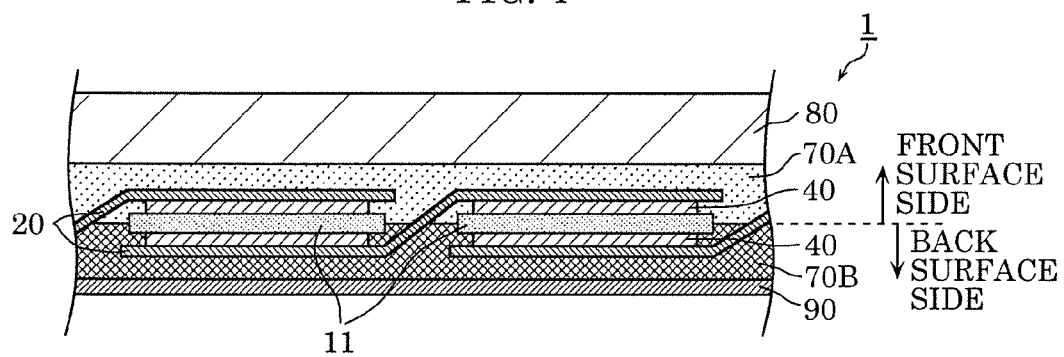
FIG. 4 is a cross-sectional view of a structure of the solar cell module according to the embodiment in the column direction.

FIG. 4 is a cross-sectional view in the column direction of a structure of solar cell module 1 according to the embodiment. Specifically, FIG. 4 is a cross-sectional view of solar cell module 1 taken along line IV-IV in FIG. 1. Solar cell module 1 illustrated in FIG. 4 includes solar cells 11, tab lines 20, bonding members 40, front surface encapsulant member 70A, back surface encapsulant member 70B, front surface protection member 80, and back surface protection member 90.

Tab lines 20 are elongated electrically conductive lines, and are ribbon-shaped metallic foil, for example. Tab lines 20 can be produced by, for example, cutting metallic foil, such as copper foil and silver foil having surfaces entirely covered with silver, solder, or the like into strips having a predetermined length. As for two solar cells 11 adjacent to each other in the column direction, tab line 20 disposed on the front surface of one of solar cells 11 is also disposed on the back surface of the other of solar cells 11. More specifically, the bottom surface of tab line 20 at an end portion is joined to bus bar electrode 112 on the front surface side of the one of solar cells 11 along the longitudinal direction of bus bar electrode 112. The upper surface of the other end of tab line 20 is joined to bus bar electrode 122 on the back surface side of the other solar cell 11 along the longitudinal direction of bus bar electrode 122. Accordingly, a solar cell string made up of solar cells 11 disposed in the column direction has a configuration in which solar cells 11 are connected in series in the column direction.

Tab lines 20 are joined to bus bar electrodes 112 and 122 by bonding members 40. In other words, bonding members 40 bonds bus bar electrodes 112 and 122 to tab lines 20 such that bus bar electrodes 112 and 122 overlap tab lines 20 in the plan view of solar cell 11. Accordingly, tab lines 20 are connected to solar cell 11 via bonding members 40.

As bonding member 40, electrically conductive adhesive paste, an electrically conductive adhesive film, an anisotropic electrically conductive film, or electrically conductive adhesive tape can be used, for example. Electrically conductive adhesive paste is a pasty adhesive obtained by dispersing electrically conductive particles into a thermosetting adhesive resin material such as an epoxy resin, an acrylic resin, or a urethane resin, for example. An electrically conductive adhesive film and an anisotropic electrically conductive film are obtained by dispersing electrically conductive particles into a thermosetting adhesive resin material and forming the material into films. A non-conductive adhesive may also be used as bonding member 40. In this case, by appropriately designing the thickness of an applied resin adhesive, a resin adhesive softens when pressure is applied for thermo compression bonding, and consequently the front surfaces of bus bar electrodes 112 and 122 are brought into direct contact with tab lines 20 and electrically connected.

This configuration allows finger electrodes 111 and 121 to collect charges generated by solar cells 11, and allows bus bar electrodes 112 and 122 to be disposed and extend in the direction intersecting finger electrodes 111 and 121, respectively, and to transmit the charges to tab lines 20.

As illustrated in FIG. 4, front surface protection member 80 is disposed on the front surface side of solar cells 11, and back surface protection member 90 is disposed on the back surface side. Front surface encapsulant member 70A is disposed between a plane including solar cells 11 and front surface protection member 80, and back encapsulant member 70B is disposed between a plane inducing solar cells 11 and back surface protection member 90. Front surface protection member 80 and back surface protection member 90 are fixed by front surface encapsulant member 70A and back encapsulant member 70B, respectively.

Front surface protection member 80 is a protection member disposed on the front surface side of solar cells 11. Front surface protection member 80 protects the inside of solar cell module 1 from rainstorm, external shock, and so on, and ensuring long term reliability against outdoor exposure of solar cell module 1. From this viewpoint, light-transmitting waterproof glass, or a light-transmitting waterproof hard resin member having a film or plate shape, for instance, can be used for front surface protection member 80, for example.

Back surface protection member 90 is a protection member disposed on the back surface side of solar cells 11. Back surface protection member 90 protects the back surface of solar cell module 1 from the outside environment, and for example, a laminated film which has a structure in which a resin film such as a polyethylene terephthalate film or an Al foil is sandwiched by resin films.

Front surface encapsulant member 70A fills a space between front surface protection member 80 and solar cells 11. Back surface encapsulant member 70B fills a space between back surface shield 90 and solar cells 11. Front surface encapsulant member 70A and back encapsulant member 70B have a sealing function for separating solar cell 11 from outside environment. Disposing front surface encapsulant member 70A and back surface encapsulant member 70B secures high heat resistance and high moisture resistance of solar cell module 1, which is assumed to be installed outside.

Front surface encapsulant member 70A is made of a light-transmissive polymer material which has a sealing function. An example of the polymer material of front surface encapsulant member 70A is a light-transmissive resin material such as ethylene vinyl acetate (EVA).

Back surface encapsulant member 70B is made of a polymer material having a sealing function. Here, back surface encapsulant member 70B is subjected to white processing, for example. An example of the polymer material for back surface encapsulant member 70B is a resin material which includes EVA that has been subjected to white processing.

Note that front surface encapsulant member 70A and back surface encapsulant member 70B may be based on the same materials, in order to simplify a manufacturing process and the adhesion at the interface between front surface encapsulant member 70A and back surface encapsulant member 70B. Front surface encapsulant member 70A and back surface encapsulant member 70B are formed by performing lamination processing on (laminating) two resin sheets (light-transmitting EVA sheet and EVA sheet that has been subjected to white processing) between which solar cells 11 (cell strings) are disposed.

4. Reinforcement Line Included in Part of Finger Electrodes on Back Surface

Next, conditions when reinforcement line 130 is included in part of finger electrodes 121 formed on back surface are described.

Figure 5A:
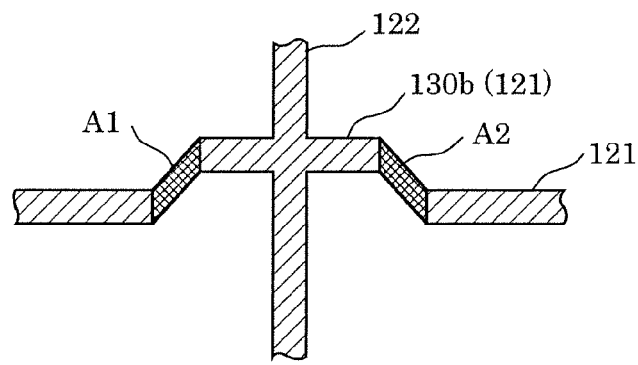
FIG. 5A is an explanatory diagram for illustrating conditions when a second finger electrode partially includes a reinforcement line.
Figure 5B:
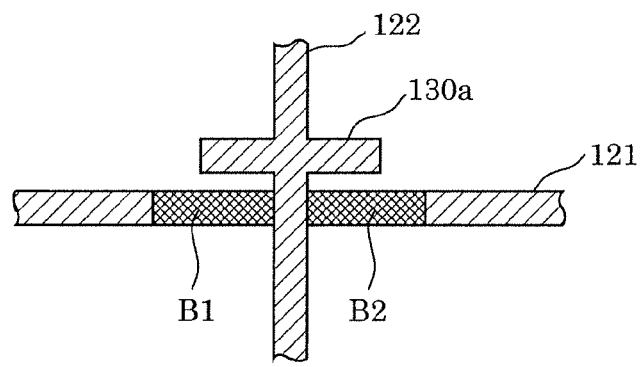
FIG. 5B is an explanatory diagram for illustrating conditions when the second finger electrode does not include the reinforcement line.

FIGS. 5A and 5B are explanatory diagrams for illustrating conditions when finger electrode 121 partially includes reinforcement line 130b. Specifically, FIG. 5A shows finger electrode 121 that partially includes reinforcement line 130b, and FIG. 5B shows finger electrode 121 that does not include reinforcement line 130b.

When finger electrode 121 partially includes reinforcement line 130b, regions A1 and A2 illustrated in FIG. 5A of finger electrode 121 are bent to include reinforcement line 130b. The angles formed between region A1 and reinforcement line 130b, and between region A2 and reinforcement line 130b are 45 degrees, for example. On the other hand, when finger electrode 121 does not include reinforcement line 130b, finger electrode 121 is a finger electrode of an approximately straight line, as illustrated in FIG. 5B. Finger electrode 121 illustrated in FIG. 5B has regions B1 and B2 instead of regions A1 and A2 included in finger electrode 121 illustrated in FIG. 5A.

For example, when the surface area of regions A1 and A2 (sum of the surface areas of region A1 and region A2) is smaller than the surface area of regions B1 and B2 (sum of the areas of region B1 and region B2), as illustrated in FIG. 5A, finger electrode 121 partially includes reinforcement line 130b. On the other hand, when the surface area of regions A1 and A2 is larger than the area of region B1 and B2, as illustrated in FIG. 5B, reinforcement line 130a which is not included in finger electrode 121 is formed, and reinforcement line 130b is not included in part of finger electrode 121.

5. Effects, Etc.

Solar cell module 1 according to the present embodiment includes: two solar cells 11 adjacent to each other, the two solar cells each having a front surface (first main surface) and a back surface (second main surface); and at least two tab lines 20 that electrically connect the two solar cells 11. At least one solar cell 11 of the two solar cells 11 includes: at least two bus bar electrodes 112 (first bus bar electrodes) disposed on the front surface; and a plurality of finger electrodes 111 (first finger electrodes) disposed on the front surface and extending in a direction intersecting the at least two bus bar electrodes 112. The at least one solar cell 11 of the two solar cells 11 also includes: at least two bus bar electrodes 122 (second bus bar electrodes) disposed on the back surface, a plurality of finger electrodes 121 (second finger electrodes) disposed on the back surface and extending in a direction intersecting the at least two bus bar electrodes 122; and a plurality of reinforcement lines 130 disposed on the back surface and extending from the at least two bus bar electrodes 122 in the direction intersecting the at least two bus bar electrodes 122. The plurality of reinforcement lines 130 are disposed at positions where the plurality of reinforcement lines 130 at least partially overlap the plurality of finger electrodes 111, respectively, in a front view of the at least one solar cell 11. Pitch p1 between the plurality of reinforcement lines 130 is different from pitch p2 between the plurality of finger electrodes 121, pitch p1 being an interval between positions where the plurality of reinforcement lines 130 intersect the at least two bus bar electrodes 122, pitch p2 being an interval at a midpoint between two adjacent tab lines 20 among the at least two tab lines 20.

This achieves a configuration in which pitch p1 between reinforcement lines 130, i.e., pitch p1 between finger electrodes 111, is different from pitch p2 between finger electrodes 121. For example, when the number of finger electrodes 111 is x, the number of finger electrodes 121 is x+n(x−1), where n is an integer greater than or equal to 0. The pitch between finger electrodes 121 does not need to be set to 1/(n+1) with respect to the pitch between finger electrodes 111, and thus this eases restrictions on the design of finger electrodes 121. Since a probe is applied to a portion where bus bar electrode 112 and finger electrode 111 intersect during the inspection of property evaluation (output evaluation) of solar cell 11 in the manufacturing process of solar cell module 1, pressure is applied to the portion where bus bar electrode 112 and finger electrode 111 intersect, and shearing stress occurs in solar cell 11. Moreover, when tab line 20 is joined to bus bar electrode 112 to overlap bus bar electrode 112, pressure is applied to a portion where bus bar electrode 112 and finger electrode 111 intersect, for example, and shearing stress occurs in solar cell 11. As compared with this, in the present embodiment, reinforcement lines 130 are disposed and extend from bus bar electrodes 122 at positions where reinforcement lines 130 overlap finger electrodes 111 in the front view of solar cell 11. This can suppress the shearing stress that occurs in solar cell 11 when pressure is applied to a portion where bus bar electrode 112 and finger electrode 111 intersect. As described above, the restrictions on the design of finger electrodes 121 can be eased and the shearing stress that occurs in solar cell 11 can be suppressed.

Among finger electrodes 121, at least one finger electrode 121 partially includes reinforcement line 130b disposed in the vicinity of the at least one finger electrode 121, reinforcement line 130b being one of reinforcement lines 130.

Here, the surface area of regions A1 and A2 illustrated in FIG. 5A is smaller as the distance between finger electrode 121 and reinforcement line 130 becomes shorter. Thus, reinforcement line 130b disposed in the vicinity of the at least one finger electrode 121 means that, for example, the surface area of regions A1 and A2 becomes smaller than the surface area of regions B1 and B2. Accordingly, finger electrode 121 partially includes reinforcement line 130b when the surface area of regions A1 and A2 is smaller than the surface area of regions B1 and B2. This enables reduction in amount of the electrically conductive resin paste to be used to form finger electrode 121 and reinforcement line 130, etc. In other words, the cost of solar cell module 1 can be reduced.

Moreover, the length of each of reinforcement lines 130 is approximately equal to the width of each of at least two tab lines 20.

As described above, pressure may be applied to the portion where bus bar electrode 112 and finger electrode 111 intersect via tab line 20. In other words, as long as reinforcement line 130 having a length approximately equal to the width of tab line 20 is formed, shearing stress that occurs in solar cell 11 can be suppressed. When the length of reinforcement line 130 is equal to or longer than the width of tab line 20, the amount of the electrically conductive resin paste to be used to form reinforcement line 130 increases. In spite of that, making the length of reinforcement line 130 equal to or longer than the width of tab line 20 is less effective in suppressing the shearing stress that occurs in solar cell 11. Thus, by making the length of reinforcement line 130 approximately equal to the width of tab line 20, the amount of the electrically conductive resin paste to be used to form reinforcement line 130 can be reduced, and the shearing stress that occurs in solar cell 11 can also be reduced.

The width of each of reinforcement lines 130 is approximately equal to the width of each of finger electrodes 111.

As described above, reinforcement lines 130 are disposed at positions where reinforcement lines 130 at least partially overlap finger electrodes 111, respectively, in the front view of solar cell 11. Here, as long as reinforcement line 130 having a width approximately equal to the width of finger electrode 111 is formed, the shearing stress that occurs in solar cell 11 can be suppressed. When the width of reinforcement line 130 is made equal to or longer than the width of finger electrode 111, the amount of the electrically conductive resin paste to be used to form reinforcement line 130 increases. In spite of that, making the width of reinforcement line 130 equal to or longer than the width of finger electrode 111 is less effective in suppressing the shearing stress that occurs in solar cell 11. Thus, by making the width of reinforcement line 130 approximately equal to the width of finger electrode 111, the amount of the electrically conductive resin paste to be used to form reinforcement line 130 can be reduced, and the shearing stress that occurs in solar cell 11 can also be reduced.

Other Embodiments

While solar cell module 1 according to one aspect of the present disclosure has been described above, the present disclosure is not limited to the embodiment described above.

For example, it is sufficient that at least one solar cell 11 of the two adjacent solar cells 11 included in solar cell module 1 has reinforcement lines 130. In other words, among solar cells 11 included in solar cell module 1, solar cell 11 without reinforcement lines 130 may be included.

Moreover, for example, the first main surface is the front surface and the second main surface is the back surface in the embodiment described above, the first main surface may be the back surface and the second main surface may be the front surface.

Moreover, for example, reinforcement lines 130 are disposed on one surface (second main surface), but reinforcement lines 130 may be disposed on both of the first main surface and the second main surface. In this case, reinforcement lines 130 are formed at positions where reinforcement lines 130 at least partially overlap finger electrodes 121, respectively, in the front view of solar cell 11. This further suppresses shearing stress that occurs in solar cell 11.

For example, in the above embodiment, the length of reinforcement line 130 is approximately equal to the width of tab line 20, but the length of reinforcement line 130 may be either shorter or longer than the width of tab line 20. However, the length of reinforcement line 130 is preferably approximately equal to the width of tab line 20.

For example, although reinforcement lines 130 are included in collector electrode 120 in the embodiment described above, the configuration is not limited to this. For example, reinforcement lines 130 may be made of materials different from the materials of bus bar electrodes 122 and finger electrodes 121, and do not need to be included in collector electrode 120.

For example, although reinforcement lines 130 include reinforcement lines 130a and 130b in the embodiment described above, the configuration is not limited to this. For example, all of reinforcement lines 130 may be reinforcement lines 130a, or may be reinforcement lines 130b.

For example, in the embodiment described above, finger electrode 121 partially includes reinforcement line 130b when the surface area of regions A1 and A2 is smaller than the surface area of regions B1 and B2. However, when there are a plurality of reinforcement lines 130 that make the surface area of regions A1 and A2 smaller than the surface area of regions B1 and B2 with respect to a certain finger electrode 121, reinforcement line 130 that makes the surface area of regions A1 and A2 the smallest may be reinforcement line 130b included in part of the certain finger electrode 121. In other words, reinforcement line 130 formed in the most vicinity of the certain finger electrode 121 may be reinforcement line 130b included in part of the certain finger electrode 121.

For example, either reinforcement line 130 or finger electrode 121 is formed at the positions on the second main surface where reinforcement line 130 or finger electrode 121 overlaps finger electrode 111 in the front view of solar cell 11 in the above embodiment. However, of the positions, there may be a position where neither reinforcement line 130 nor finger electrode 121 is formed.

For example, in the above embodiment, although the semiconductor material of the photoelectric converter of solar cell 11 is silicon, the semiconductor material is not limited to this. Gallium arsenide (GaAs) or indium phosphorus (InP), for example, may be used as the semiconductor material of the photoelectric converter of solar cell 11.

Note that the scope of the present disclosure may also include embodiments as a result of adding various modifications to the embodiment that may be conceived by those skilled in the art, and embodiments obtained by combining structural components and functions in the embodiment in any manner as long as the combination does not depart from the scope of essence of the present disclosure.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A solar cell module, comprising:
   two solar cells adjacent to each other, the two solar cells each having a first main surface and a second main surface; and
   at least two tab lines that electrically connect the two solar cells, wherein
   at least one solar cell of the two solar cells includes:
      at least two first bus bar electrodes disposed on the first main surface;
      a plurality of first finger electrodes disposed on the first main surface and extending in a direction intersecting the at least two first bus bar electrodes;
      at least two second bus bar electrodes disposed on the second main surface;
      a plurality of second finger electrodes disposed on the second main surface and extending in a direction intersecting the at least two second bus bar electrodes; and
      a plurality of reinforcement lines disposed on the second main surface and extending from the at least two second bus bar electrodes in the direction intersecting the at least two second bus bar electrodes,
   the plurality of reinforcement lines are disposed at positions where the plurality of reinforcement lines at least partially overlap the plurality of first finger electrodes, respectively, in a front view of the at least one solar cell, and
   a first pitch between each immediately adjacent pair of the plurality of reinforcement lines is different from a second pitch between each immediately adjacent pair of the plurality of second finger electrodes, the first pitch being an interval between positions where the plurality of reinforcement lines intersect the at least two second bus bar electrodes, the second pitch being measured at a location equidistant between two adjacent tab lines among the at least two tab lines, and
   the first pitch between each immediately adjacent pair of the plurality of reinforcement lines is same as a third pitch between each immediately adjacent pair of the plurality of first finger electrodes, the third pitch being measured as a location between positions where the at least two first bus bar electrodes intersect the plurality of first finger electrodes.

2. The solar cell module according to claim 1, wherein among the plurality of second finger electrodes, at least one second finger electrode is integrated with at least one reinforcement line among the plurality of reinforcement lines.

3. The solar cell module according to claim 1, wherein a length of each of the plurality of reinforcement lines is approximately equal to a width of each of the at least two tab lines.

4. The solar cell module according to claim 1, wherein a width of each of the plurality of reinforcement lines is approximately equal to a width of each of the plurality of first finger electrodes.

* * * * *